United States Patent [19]

Suganuma

[11] 4,366,450
[45] Dec. 28, 1982

[54] AUTOMATIC GAIN CONTROL CIRCUIT

[75] Inventor: Hisashi Suganuma, Saitama, Japan

[73] Assignee: Pioneer Electronic Corporation, Tokyo, Japan

[21] Appl. No.: 122,905

[22] Filed: Feb. 20, 1980

Related U.S. Application Data

[63] Continuation-in-part of Ser. No. 930,116, Aug. 1, 1978, Pat. No. 4,229,707.

[30] Foreign Application Priority Data

Aug. 1, 1977 [JP] Japan .................................. 52/81552
Aug. 10, 1977 [JP] Japan .................................. 52/95814

[51] Int. Cl.³ .......................... H03G 3/30; H03F 3/193
[52] U.S. Cl. ..................................... 330/285; 330/277; 330/300
[58] Field of Search ......................... 330/277, 285, 300

[56] References Cited

U.S. PATENT DOCUMENTS 4,243,947 1/1981 Glennon ............................. 330/285

FOREIGN PATENT DOCUMENTS 46-13444 10/1971 Japan .................................. 330/285

OTHER PUBLICATIONS

"Variable Gain RF Amplifier with Superior Gain Control Range and Overload Characteristics", *Research Disclosure*, May 1979, p. 211.

Primary Examiner—James B. Mullins
Attorney, Agent, or Firm—Sughrue, Mion, Zinn, Macpeak & Seas

[57] ABSTRACT

An automatic gain control circuit where the direct current potential levels of the gate and the source of a field effect transistor in a preamplifier stage are maintained substantially equal during automatic gain control. In the first embodiment, the gate of the field effect transistor is responsive to a high frequency input signal and the drain provides the amplified high frequency input signals as an output signal. The source is connected to electrical ground by an inductor and is connected to a voltage source having a voltage level controlled in accordance with the automatic gain control signal. The inductor acts to shunt to ground the direct current component of the supply voltage provided to the source. In the second embodiment, the gate of the field effect transistor is responsive to a high frequency input signal and the source is connected to electrical ground. The drain is connected to a voltage source having a voltage level controlled in accordance with the automatic gain control signal and provides the amplified high frequency input signal as an output signal. The d.c. levels of the gate and source are maintained substantially equal and the AGC signal maintains a substantially zero d.c. bias on the field effect transistor to thereby minimize distortion.

5 Claims, 11 Drawing Figures

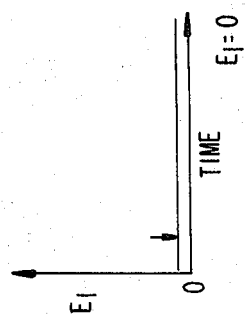
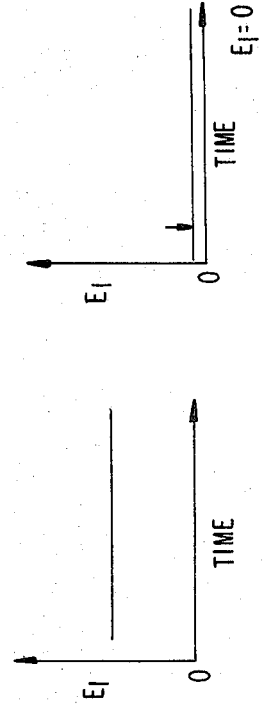
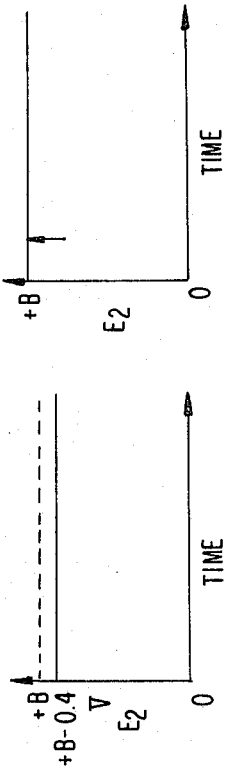
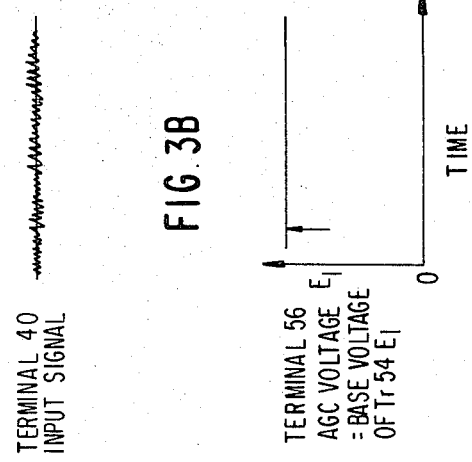
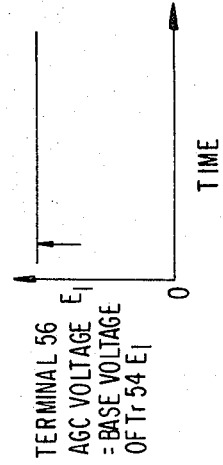

AUTOMATIC GAIN CONTROL CIRCUIT

This application is a continuation-in-part of copending application Ser. No. 930,116 filed Aug. 1, 1978, now U.S. Pat. No. 4,229,707.

BACKGROUND OF THE INVENTION

1. Field of the Invention

The present invention relates generally to automatic gain control circuits, and more particularly, to an automatic gain control circuit exhibiting a decrease in the intermodulation distortion level and an increase in the signal-to-noise ratio under automatic gain control 2. Description of the Prior Art The conventional automatic gain control circuit operates to maintain constant the level of the received signals, whereby the average level of the output audio signal from the receiver is maintained constant. In other words, the automatic gain control circuit results in the signal level of the audio output signal being substantially constant and, thus, immune to fluctuations in the level of the received signal. The constant level of the audio signal is a very attractive feature, and this accounts for the fact that almost all currently available radio receivers include automatic gain control circuits.

One type of conventional automatic gain control circuit is so designed that the gate or source of an active device, such as a field effect transistor, used in a preamplifier stage for amplifying the radio frequency signals present at the antenna input terminal, is provided with an automatic gain control signal to maintain substantially constant the level of the output signal from the preamplifier stage.

The automatic gain control signal so provided has a direct current component and also has an alternating current component when the level of the radio frequency signals present at the antenna input terminal or the like is rapidly fluctuating. Thus, in the conventional automatic gain control circuit described above, the gate and the source of the field effect transistor usually have different direct current potential levels. The different potential levels result in the conventional automatic gain control circuit exhibiting an increase in the intermodulation distortion level and a decrease in the signal-to-noise ratio under automatic gain control.

SUMMARY OF THE INVENTION

It is an object of the present invention to provide an automatic gain control circuit which exhibits a decrease in the intermodulation distortion level and an increase in the signal-to-noise ratio under automatic gain control.

It is a further object of the present invention to provide an automatic gain control circuit where the direct current potential levels of the gate and source of the field effect transistor connected in the common-source configuration are maintained substantially equal.

It is an additional object of the present invention to provide an automatic gain control circuit in which a substantially zero d.c. bias is maintained on a field effect transistor connected in a common source configuration to thereby minimize distortion.

In an automatic gain control circuit according to the present invention, the direct current potential levels of the gate and the source of a field effect transistor in a preamplifier stage are maintained substantially equal during automatic gain control. In the first embodiment, the gate of the field effect transistor is responsive to a high frequency input signal and the drain provides the amplified high frequency input signals as an output signal. The source is connected to electrical ground by an inductor and is connected to a voltage source having a voltage level controlled in accordance with the automatic gain control signal. The inductor acts to shunt to ground the direct current component of the supply voltage provided to the source. In the second embodiment, the gate of the field effect transistor is responsive to a high frequency input signal and the source is connected to electrical ground. The drain provides the amplified high frequency input signal as an output signal, and is also connected to a voltage source having a voltage level controlled in accordance with the automatic gain control signal. The direct current levels of the gate and source are maintained substantially equal. The amplification factor of the field effect transistor is controlled by the AGC signal to maintain almost zero d.c. biasing across of the field effect transistor and thereby minimize distortion.

BRIEF DESCRIPTION OF THE DRAWINGS

FIGS. 3A–3C are illustrations of the signals present at the input terminal 40, the base of transistor 54 and base of transistor 66, respectively, for an input signal having a small electric field strength;

FIGS. 4A–4C are illustrations of the signals present at the input terminal 40, the base of transistor 54 and base of transistor 66, respectively, for an input signal having a medium electric field strength; and FIGS. 5A–5C are illustrations of the signals present at the input terminal 40, the base of transistor 54 and base of transistor 66, respectively, for an input signal having a large electric field strength.

DETAILED DESCRIPTION OF THE INVENTION

The present invention provides an automatic gain control circuit which exhibits a decrease in the intermodulation distortion level and an increase in the signal-to-noise ratio under automatic gain control. These two results are achieved by maintaining substantially equal the direct current potential levels of the gate and source of the field effect transistor of the automatic gain control circuit. Two embodiments of the present invention are shown.

Figure 1:
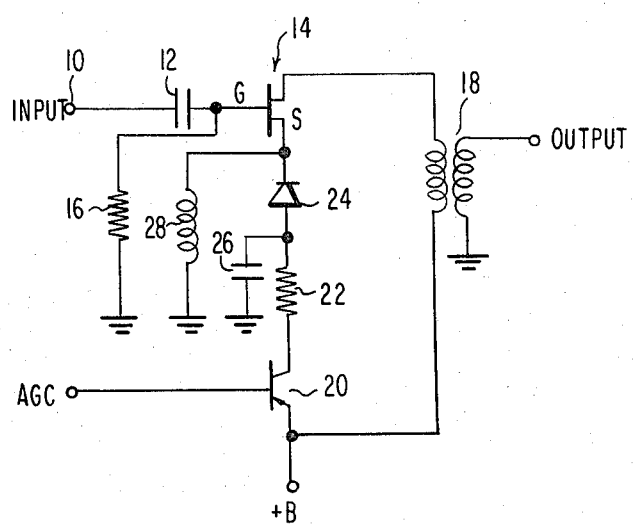
FIG. 1 is a schematic electrical diagram of the first embodiment of the automatic gain control circuit of the present invention.

In the first embodiment of the automatic gain control circuit of the present invention as shown in FIG. 1, the radio frequency antenna signal is applied to a terminal 10. Terminal 10 is connected via a coupling capacitor 12 to the gate of an active decive 14, such as a field effect transistor. A resistor 16 is connected between electrical ground and the gate of field effect transistor 14. Coupling capacitor 12 and resistor 16 form a high-pass filter which passes signals applied to terminal 10 that are in the desired high frequency range.

The drain of field effect transistor 14 is connected to one side of a winding of a coupling transformer 18, which has the other side of the winding connected to an electric source +B. The other winding of coupling transformer 18 is the output winding. Thus, field effect transistor 14 is connected in a common-source configuration.

The automatic gain control signal from another stage of the radio receiver (not shown), is provided to the base of an active device 20, such as a PNP transistor. The emitter of PNP transistor 20 is connected to electric source +B. Thus, the voltage levels of the electric source +B and of the automatic gain control signal determine the forward biasing level of the emitter-base junction of PNP transistor 20.

The collector of PNP transistor 20 is connected via a resistor 22 and a diode 24 in the forward-bias direction to the source of the field effect transistor 14. Diode 24 can be of any suitable type, such as a silicon or germanium diode. Diode 24 exhibits a variable resistance depending on the level of biasing in the forward direction. A capacitor 26 is connected between the junction of diode 24 and resistor 22 and electrical ground. Capacitor 26 is provided to bypass high frequency signals. An inductor 28 is connected between the source of field effect transistor 14 and electrical ground.

The operation of the automatic gain control circuit of the present invention is now described. Upon application of an antenna signal to terminal 10, this antenna signal is supplied through a capacitor 12 to gate of the field effect transistor 14, where it is amplified, and then is supplied via the drain through the coupling transformer 18 to the next stage of the receiver (not shown). In this operation, the direct current output at the collector of transistor 20 whose amplification level is controlled by the automatic gain control signal, is applied via the series connected resistor 22 and the variable resistance diode 24 to the source of the field effect transistor 14. Thus, the antenna signal amplified by the field effect transistor 14 is varied in response to the alternating current component of the automatic gain control signal, as a result of which the output signal of field effect transistor 14 which forms the preamplifier, is maintained at a substantially constant level at all times. On the other hand, because inductor 28 is connected between the source of the field effect transistor 14 and electrical ground, the direct current component of the output signal from transistor 20, which corresponds to the direct current component of the automatic gain control signal, is shunted to electrical ground through the inductor 28. In other words, the automatic gain controlled output signal from the collector of transistor 20 controls the biasing of the field effect transistor 14 only with respect to the alternating current component of the automatic gain control signal. Accordingly, even in the case where the automatic gain control signal is applied directly to the source of field effect transistor 14 (and not via transistor 20, resistor 22, and diode 24), AGC signal direct current levels of the gate and the source of the field effect transistor 14 are maintained substantially constant and equal due to the direct current shunting to ground by inductor 28. When the automatic gain control operation is carried out, negative feedback is effected, and the signal distortion is reduced. Accordingly, the intermodulation distortion level is reduced and the signal-to-noise ratio is increased under automatic gain control in the first embodiment of the present invention.

Figure 2:
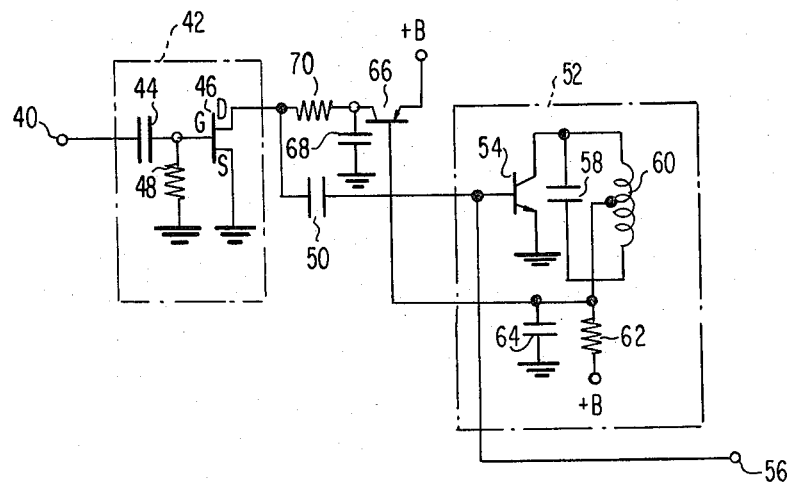
FIG. 2 is a schematic electrical diagram of the second embodiment of the automatic gain control circuit of the present invention.

In the second embodiment of the automatic gain control circuit of the present invention, as shown in FIG. 2, the radio frequency antenna signal is applied to a terminal 40. Terminal 40 is connected to the input of a preamplifier, designated generally by the reference numeral 42. Specifically, terminal 40 is connected via a coupling capacitor 44 to the gate of an active device 46, such as a field effect transistor 46. A resistor 48 is connected between electrical ground and the gate of field effect transistor 46. Coupling capacitor 44 and resistor 48 form a high-pass filter which passes signals applied to terminal 40 that are in the desired high frequency range.

The source of field effect transistor 46 is connected to electrical ground, and the drain of field effect transistor 46 is connected via a coupling capacitor 50 to the input of a tuning circuit, designated generally by the reference numeral 52. Thus, field effect transistor 46 is connected in a common-source configuration. In the common-source configuration, the amplification factor of the field effect transistor increases as the potential on the drain with respect to the gate is increased.

Tuning circuit 52 includes an NPN transistor 54, whose emitter is connected to electrical ground, and whose base is connected to coupling capacitor 50 and is provided with an automatic gain control signal from a terminal 56. Coupling capacitor 50 prevents the direct current component of the automatic gain control signal from being passed to the drain of field effect transistor 46. The collector of transistor 54 is connected to one side of a capacitor 58 and a winding of a high frequency transformer 60 connected in parallel. A center tap of transformer 60 is connected via a resistor 62 to an electric source +B and to electrical ground via a capacitor 64. Capacitor 64 is provided to bypass high frequency signals. It should be noted that an automatic gain control signal is present at the center tap of transformer 60.

The automatic gain control signal present at the center tap of transformer 60 is provided to the base of an active device 66, such as a PNP transistor 66. The emitter of transistor 66 is connected to electric source +B. Thus, the voltage levels of the electric source +B and of the automatic gain control signal determine the forward biasing level of the emitter-based junction of the PNP transistor 66. The collector of PNP transistor 66 is connected via a resistor 70 to the drain of field effect transistor 46. A capacitor 68 is connected between the collector of transistor 66 and electrical ground and is provided to bypass high frequency signals.

In the automatic gain control circuit of the second embodiment of the present invention, the supply voltage applied to the drain of the field effect transistor 46 is controlled in accordance with the automatic gain control signal applied to the base of PNP transistor 66. Specifically, the direct current component of the supply voltage is raised and lowered by the automatic gain control direct current component at the base of PNP transistor 66 in accordance with the signal level at the gate of field effect transistor 46. The d.c. potentials present at the gate and source of field effect transistor 46 are maintained substantially equal in the direct current mode because both gate and source are coupled to ground, and the amplification factor of the field effect transistor is controlled in accordance with the level of the AGC signal in order to minimize the distortion.

When little or no RF antenna signal is applied to the input terminal 40 as shown in FIG. 3A, the capacitor 44 and resistor 48 will operate to isolate the gate from any d.c. potential and to maintain the d.c. level of the gate at substantially zero. Since the source is directly grounded, the potentials of the source and gate in the d.c. mode are maintained substantially at zero volts. In this case, no AGC signal appears, and the power source voltage B+ is applied to the terminal 56 as shown in FIG. 3B, to thereby bias the transistor 54 into conduction. Since the transistor 54 is conducting, the junction between the resistor 62 and the center tap of transformer 60 will fall to a lower level as shown in FIG. 3C, thus also biasing transistor 66 into conduction. In this state the drain of FET 46 will be at substantially B+, and FET 46 will thus exhibit a high amplification factor for low level RF signals.

When an RF antenna signal having a medium electric field strength as shown in FIG. 4A is received at the input terminal 40, the AGC signal at terminal 56 drops to a lower level as shown in FIG. 4B. This lower AGC signal applied to the base of transistor 54 will operate to somewhat decrease the conductivity of that transistor, causing a consequent increase in the d.c. potential at the junction between resistor 62 and the center tap of transformer 60. Thus, the base voltage of transistor 66 will be slightly raised as shown in FIG. 4C, and the conductivity of the transistor 66 will decrease. A decrease in the conductivity of transistor 66 will result in a decrease of the supply voltage to the drain of FET 46 so that the gain of the FET will be decreased.

When an RF antenna signal having a high electric field strength is received at the input terminal 40 as shown in FIG. 5A, the AGC signal at terminal 56 drops to a very low level as shown in FIG. 5B. This will result in the transistor 54 becoming substantially non-conductive so that the potential at the junction between resistor 62 and the center tap of transformer 60 will be at substantially B+. Transistor 66 will thus become substantially non-conductive and the drain current supplied to FET 46 will become very low. Thus, the gain of FET 46 for high level RF input signals will be low.

It should be noted that, although the AGC signals illustrated in FIGS. 3B-5B are represented by substantially constant levels, the actual AGC signal will slightly vary according to the variations in the electric field strength of the input signal, but these slight variations may be ignored for the purposes of this description. It should be clear from the above description, that the circuitry of FIG. 2 will control the gain of FET 46 in proportion to the magnitude of the electric field strength of the input signal, thus maintaining a substantially constant amplification factor regardless of the strength of the input signal. Further, in contrast to conventional AGC circuitry in which application of the AGC signal will result in an increase in the gate-to-source voltage which will increase distortion, the circuitry of FIG. 2 maintains a substantially zero d.c. bias on the FET so that the distortion factor will be minimized.

In the second embodiment described above, transistor 66 controlling the electric source of the field effect transistor 46 receives the signal corresponding to the automatic gain control signal supplied from the tuning circuit 52. It should be noted, however, that the second embodiment of the present invention is not limited thereto. In other words, the automatic gain control signal itself may be directly applied to the base of PNP transistor 66 to achieve the desired direct current mode of operation of field effect transistor 46.

What is claimed is:

1. An automatic gain control circuit comprising:
   (a) a preamplifier means having a field effect transistor (FET) responsive to a high frequency input signal for amplifying said high frequency input signal and for providing said amplified high frequency input signal as an output signal, said field effect transistor having a gate, source and drain, said gate being responsive to said high frequency input signal, said source being coupled to electrical ground and said output signal being provided at said drain;
   (b) an automatic gain control signal source;
   (c) supply voltage means for providing to said drain from a voltage source a supply voltage controlled by said automatic gain control signal; and
   (d) means for biasing said field effect transistor such that said gate and said source are at substantially the same d.c. potential for all values of said automatic gain control signal.

2. An automatic gain control circuit as defined in claim 1, wherein said supply voltage means includes an active device connected between said voltage source and said FET drain and controlled by said automatic gain control signal for providing said supply voltage to said FET drain in accordance with said automatic gain control signal.

3. An automatic gain control circuit as defined in claim 2 wherein said active device of said supply voltage means is a second transistor having an emitter, a base and a collector, said emitter connected to said voltage source, said base responsive to said automatic gain control signal and said collector providing said supply voltage in accordance with said automatic gain control signal.

4. An automatic gain control circuit as defined in claim 3, wherein said supply voltage means further includes a first resistor and a first capacitor, said first resistor being connected between said collector of said second transistor and said drain of said field effect transistor, and said first capacitor being connected between said collector of said second transistor and electrical ground.

5. An automatic gain control circuit as defined in claim 1 wherein said biasing means comprises a second resistor coupled between said gate and ground and a second capacitor coupled between said gate and a source of said high frequency signal, and wherein said source is coupled directly to ground.

* * * * *